United States Patent
Cho

(10) Patent No.: US 8,183,632 B2
(45) Date of Patent: May 22, 2012

(54) SEMICONDUCTOR DEVICE AND METHOD OF MANUFACTURING THE SAME

(75) Inventor: Cheol Ho Cho, Bucheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 230 days.

(21) Appl. No.: 12/633,990

(22) Filed: Dec. 9, 2009

(65) Prior Publication Data

US 2010/0148258 A1 Jun. 17, 2010

(30) Foreign Application Priority Data

Dec. 11, 2008 (KR) .......................... 10-2008-0126177

(51) Int. Cl.
*H01L 29/78* (2006.01)

(52) U.S. Cl. ................................ 257/343; 257/E21.427

(58) Field of Classification Search .................. 257/343, 257/E21.427, E29.256; 438/286
See application file for complete search history.

(56) References Cited

U.S. PATENT DOCUMENTS 6,909,143 B2 * 6/2005 Jeon et al. ..................... 257/335

* cited by examiner

*Primary Examiner* — Roy Potter
(74) *Attorney, Agent, or Firm* — Saliwanchik, Lloyd & Eisenschenk

(57) ABSTRACT

Disclosed are a semiconductor device and a method of manufacturing the same. The semiconductor device includes a substrate formed therein with a first conductive type well, and an LDMOS device formed on the substrate. The LDMOS device includes a gate electrode, gate oxides formed below the gate electrode, a source region formed in the substrate at one side of the gate electrode, and a drain region formed in the substrate at an opposite side of the gate electrode. The gate oxide includes first and second gate oxides disposed side-by-side and having thicknesses different from each other.

4 Claims, 5 Drawing Sheets

SEMICONDUCTOR DEVICE AND METHOD OF MANUFACTURING THE SAME

CROSS-REFERENCE TO RELATED APPLICATION

This application claims the benefit under 35 U.S.C. §119 of Korean Patent Application No. 10-2008-0126177, filed Dec. 11, 2008, which is hereby incorporated by reference in its entirety.

BACKGROUND

In general, a semiconductor device employs a supply voltage of 3.3V or less. However, the semiconductor device may include a high voltage transistor employing a high supply voltage of 5V or more.

The high voltage transistor is formed with a low voltage transistor. A lever shifter is provided between a circuit part driven by a high voltage and a circuit part driven by a low voltage to serve as a voltage buffer in a circuit employing a high voltage together with a low voltage.

However, if the level shifter is used, the size of a power chip is increased, thereby causing delay to internal signals.

BRIEF SUMMARY

According to an embodiment, a semiconductor device is provided that includes a substrate formed therein with a first conductive type well, and a lateral diffused metal oxide semiconductor (LDMOS) device formed on the substrate. The LDMOS device includes a gate electrode, a gate oxide formed below the gate electrode, a source region formed in the substrate at one side of the gate electrode, and a drain region formed in the substrate at an opposite side of the gate electrode. The gate oxide includes first and second gate oxides disposed side-by-side in a double structure and having thicknesses different from each other.

According to another embodiment, a method of manufacturing a semiconductor device is provided that includes forming a first conductive type deep well in a second conductive type substrate; forming a second conductive type body and a first conductive type well in the first conductive type deep well; forming a double structure gate oxide on the substrate; forming a gate electrode on the double structure gate oxide; and forming a source region in the second conductive type body and a drain region in the first conductive type well.

DETAILED DESCRIPTION

Hereinafter, a semiconductor device and a method of manufacturing the same according to an embodiment will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
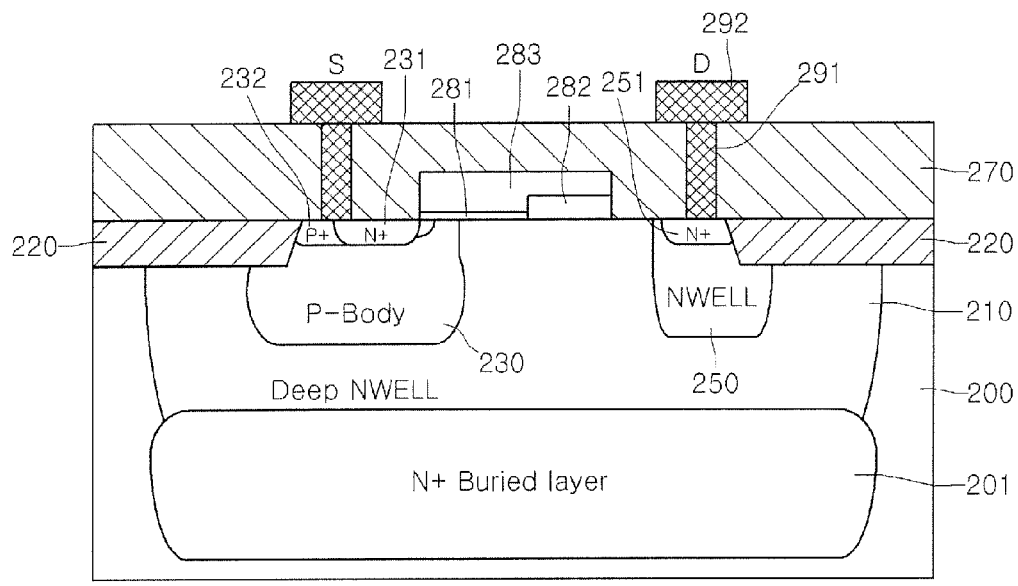
FIG. 1 is a view showing a semiconductor device according to an embodiment.
Figure 2:
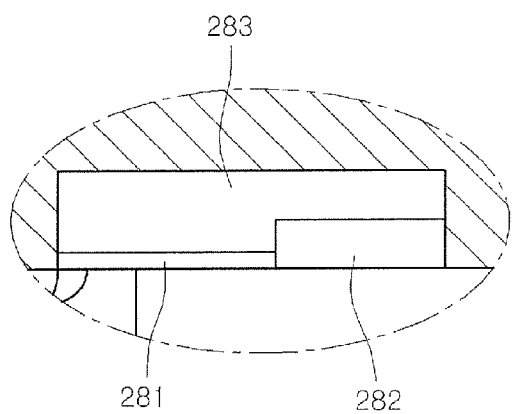
FIG. 2 is a view showing gate oxides having a double structure in accordance with an embodiment.

FIG. 1 is a view showing the structure of a semiconductor device according to an embodiment, and FIG. 2 is a detailed view showing a gate oxide having a double structure according to an embodiment.

Referring to FIGS. 1 and 2, a lateral diffused metal oxide semiconductor (LDMOS) device according to an embodiment includes a heavily doped buried layer 201 of a first conductive type formed at a deep region of a second conductive type semiconductor substrate 200. According to one embodiment, the first conductive type is N type and the second conductive type is P type. A P type epitaxial layer of the substrate may be disposed above the N type buried layer 201. When a voltage is applied to an N+ type drain region 251, the N type buried layer 201 reduces the width of a depletion region expanding from a P type body 230, so that a punch through voltage is substantially increased.

The P type epitaxial layer can be formed by precipitating a semiconductor crystal in a gas state on a single crystalline wafer. The P type epitaxial layer is formed by growing a crystal along a crystalline axis of a P type substrate. The epitaxial layer reduces the resistance of the P type substrate.

An N type deep well 210 is formed in the semiconductor substrate 200. In one embodiment, the N type deep well 210 is formed in the P type epitaxial layer portion of the substrate 200). In operation, a channel region is formed in the vicinity of the surface of the P type body 230, which exists between a contact surface of the P type body 230 and the N type deep well 210 and an N+ type source region 231, according to a bias voltage applied to a gate electrode 283.

The semiconductor substrate 200 is provided at a predetermined upper portion thereof with a first gate oxide 281 and a second gate oxide 282 having different thicknesses in a double structure, and a gate electrode 283.

The gate electrode 283 is formed over the gate oxides having the double structure. In other words, the gate electrode 283 is formed over the first and second gate oxides 281 and 282.

The P type body 230 is disposed in the semiconductor substrate 200 at one side of the gate electrode 283, and the N type source region 231 and a P+ type contact region 232 are formed in the P type body 230. The P type body 230 may be heavily doped in order to improve a punch through phenomenon of the LDMOS.

The N type well 250 is disposed below the side of the gate electrode 283 opposite the P type body on the semiconductor substrate 200. An N+ type drain region 251 is formed in the N type well 250. An isolation layer 220 is formed on the semiconductor substrate to isolate the device. Spacers may be formed at both sidewalls of the gate electrode 283.

An interlayer dielectric layer 270 is formed on the semiconductor substrate 200, and contact plugs 291 passing through the interlayer dielectric layer 270 are connected to the N+ type source region 231 and the N+ type drain region 251, respectively. Metal patterns 292 connected with the contact plugs 291 are formed on the interlayer dielectric layer 270.

In an embodiment, the first gate oxide is adjacent to the P type body 230, and the second gate oxide 282 is adjacent to an N type well 250. The second gate oxide 282 has a thickness thicker than that of the first gate oxide 281 in order to improve a characteristic in which an electrical field is excessively formed at the side of a drain in an existing LDMOS device.

In order to inhibit an electrical field from being excessively generated at the side of the drain, the distance between the drain and a gate may be shortened. However, this may increase the chip size by requiring the inclusion of a level shifter. Accordingly, the second gate oxide 282 is used to inhibit the electrical field from being excessively generated at the side of the drain without shortening the distance between the gate and the drain. In other words, a double structure of the first and second gate oxides 281 and 282 having different thicknesses can be used to inhibit the excessive generation of an electrical field at the side of the drain.

Accordingly, the second gate oxide 282 positioned closer to the drain (that is, the N type well 250) is thicker than the first gate oxide 281. The second gate oxide 282 may be thicker than the first gate oxide 281 by 160 Å to 200 Å. For example, when the first gate oxide 281 has a thickness of 120 Å, the second gate oxide 282 may have a thickness of 280 Å to 320 Å.

The second gate oxide 282 may reduce the driving voltage in the LDMOS device, and inhibit an electrical field from being excessively generated at the side of the drain.

Figure 9:
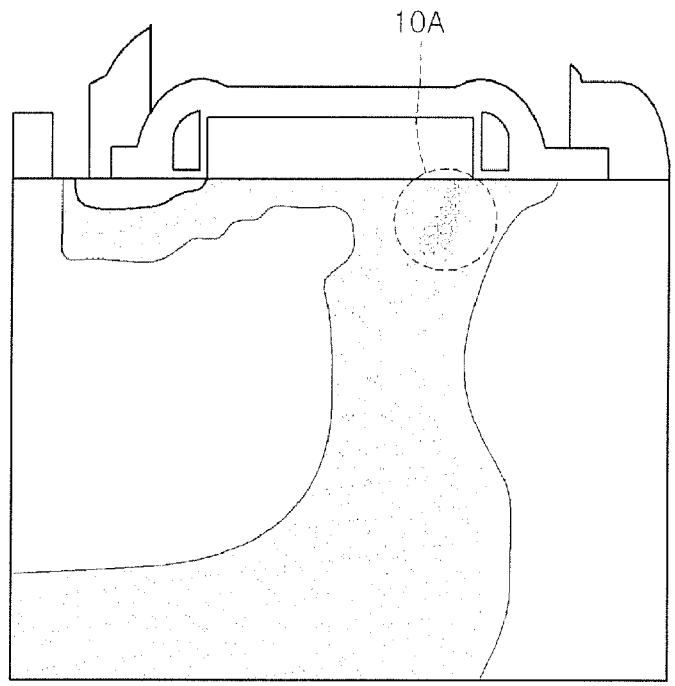
FIG. 9 is a view illustrating an electrical characteristic in a device including gate oxides having the same thickness.
Figure 10:
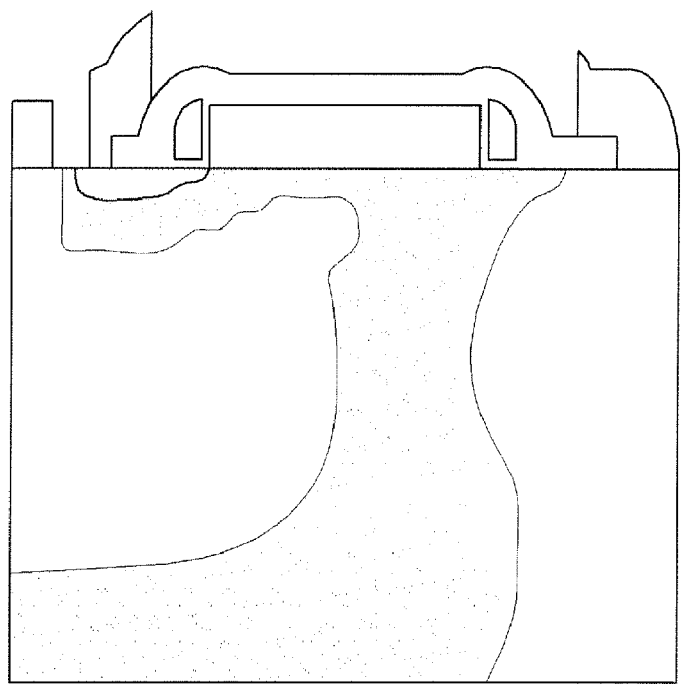
FIG. 10 is a view illustrating an electrical characteristic in a device including gate oxides having a double structure according to the embodiment.

FIG. 9 is a view illustrating an electrical characteristic in a device including gate oxides having the same thickness, and FIG. 10 is a view illustrating an electrical characteristic in a device including gate oxides having a double structure in accordance with an embodiment of the invention.

As shown in FIG. 9, when the gate oxides having a uniform thickness are formed, an excessive electrical field 10A is formed at the side of a drain adjacent to the N+ type drain region (see N type well 250 and N+ drain region 251 of FIG. 1) with respect to a gate electrode. When the excessive electrical field has been formed at the side of the drain, the operating characteristic of the device is degraded, and a level shifter is required for the interface with a low-voltage CMOS region.

In contrast, as shown in FIG. 10, when gate oxides having a double structure are formed according to the embodiment, the device is driven by a low voltage, and an electrical field formed at the side of the drain is spread.

Hereinafter, a method of manufacturing the semiconductor device according to an embodiment will be described.

FIGS. 3 to 8 are views showing a method of manufacturing the semiconductor device according to an embodiment.

Figure 3:
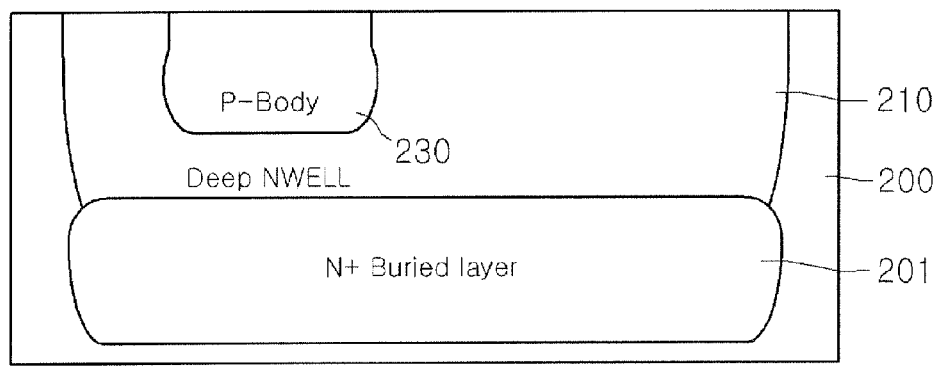
FIGS. 3 to 8 are views showing a method of manufacturing a semiconductor device according to an embodiment.

Referring to FIG. 3, after defining an LDMOS device area in the semiconductor substrate, a heavily doped buried layer 201 having the N type corresponding to the first conducive type is formed on a substrate 200 for the LDMOS device.

Then, although not shown, the semiconductor substrate 200 of the LDMOS device is epitaxially grown to form a P type epitaxial layer.

Then, an N type deep well 210 is formed on the N type buried layer 201 of the substrate 200, and a body region 230 having a P type corresponding to the second conductive type is formed in the N type deep well 210.

Figure 4:
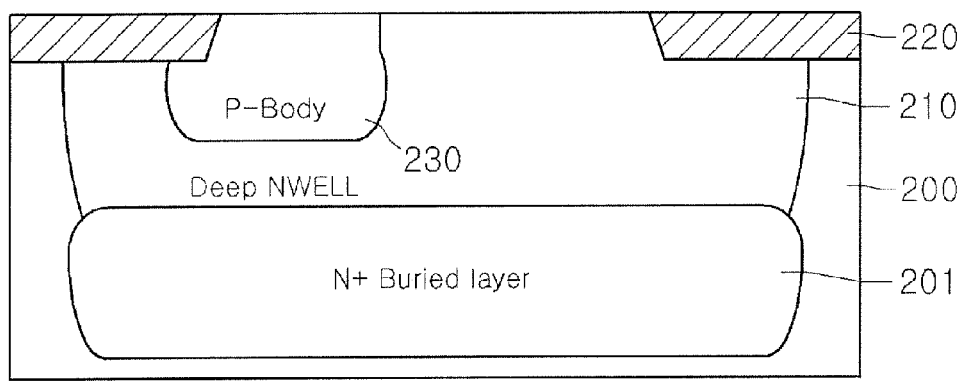

Thereafter, referring to FIG. 4, a plurality of isolation layers 220 are formed in the semiconductor substrate 200.

Figure 5:
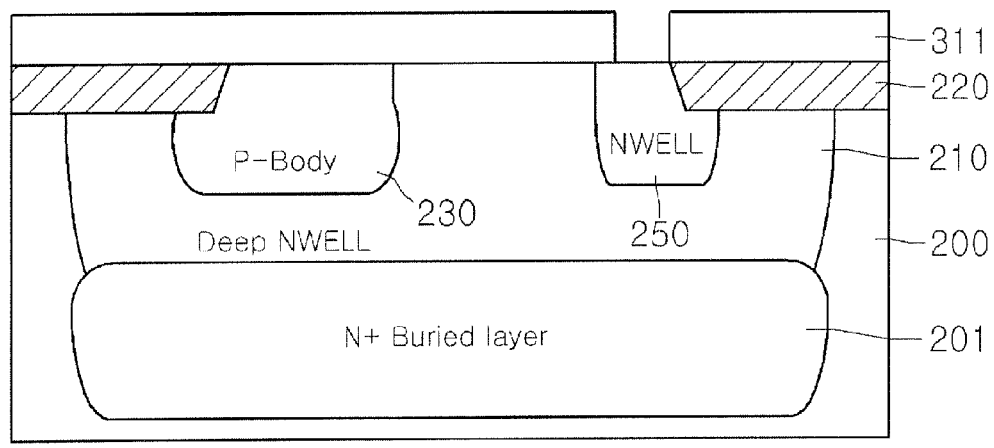

Next, referring to FIG. 5, an ion implantation process is performed to form the N type well 250 in the N type deep well 210. The ion implantation process can be carried out using a photoresist pattern 311 exposing regions into which N-type ions are to be implanted.

Figure 6:
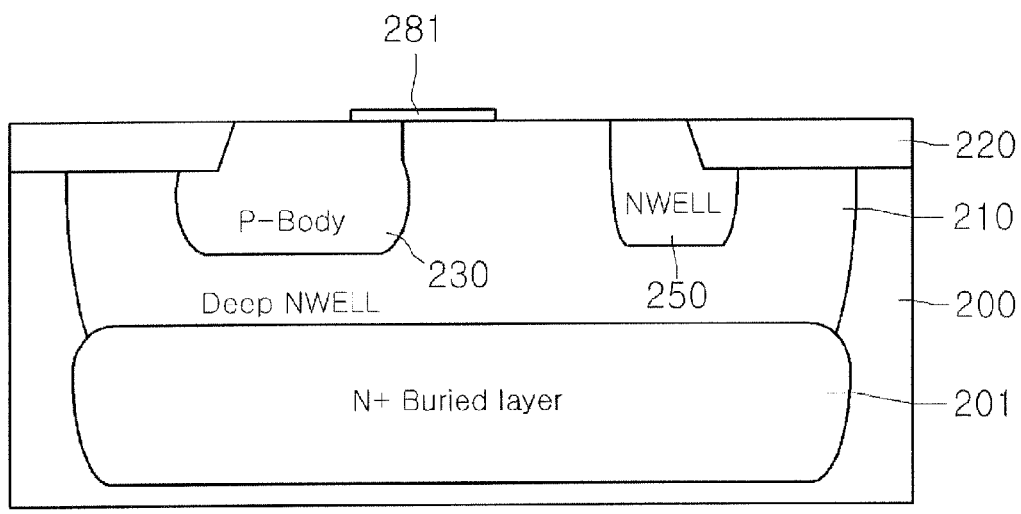

Thereafter, referring to FIG. 6, in order to form gate oxides having a double structure in accordance with an embodiment, a nitride layer (not shown) is formed on the semiconductor substrate 200 to expose an area for a first gate oxide, and the surface of the substrate 200 is oxidized at a predetermined thickness by using the nitride layer as a mask, thereby forming the first gate oxide 281. The nitride layer opened to the area for the first gate oxide may be removed.

The first gate oxide 281 is thinner than a second gate oxide formed in the subsequent process by a thickness of 160 Å to 200 Å.

A second nitride layer is formed opened at one side of a region where the first gate oxide 281 has been grown, and a second gate oxide 282 connected with one side of the first gate oxide 281 is formed in the exposed region. The second gate oxide 282 is grown thicker than the first gate oxide 281 by a thickness 160 Å to 200 Å while being connected with one side of the first gate oxide 281.

Figure 7:
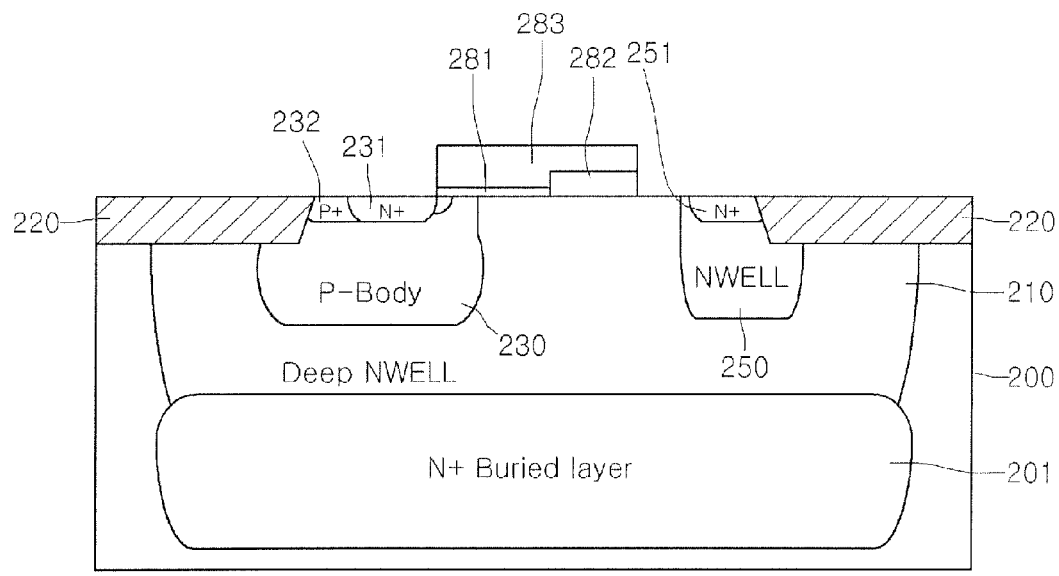

Accordingly, as shown in FIG. 7, the gate oxides having a double structure are formed. The second gate oxide 282 constituting the double structure is formed at the drain side of the device. For example, the second gate oxide 282, which is disposed at a side adjacent to an N type well or an N+ type drain region, is thicker than the first gate oxide 281.

Next, the gate electrode 283 is formed on the gate oxides 281 and 282 having the double structure by using polysilicon.

Figure 8:
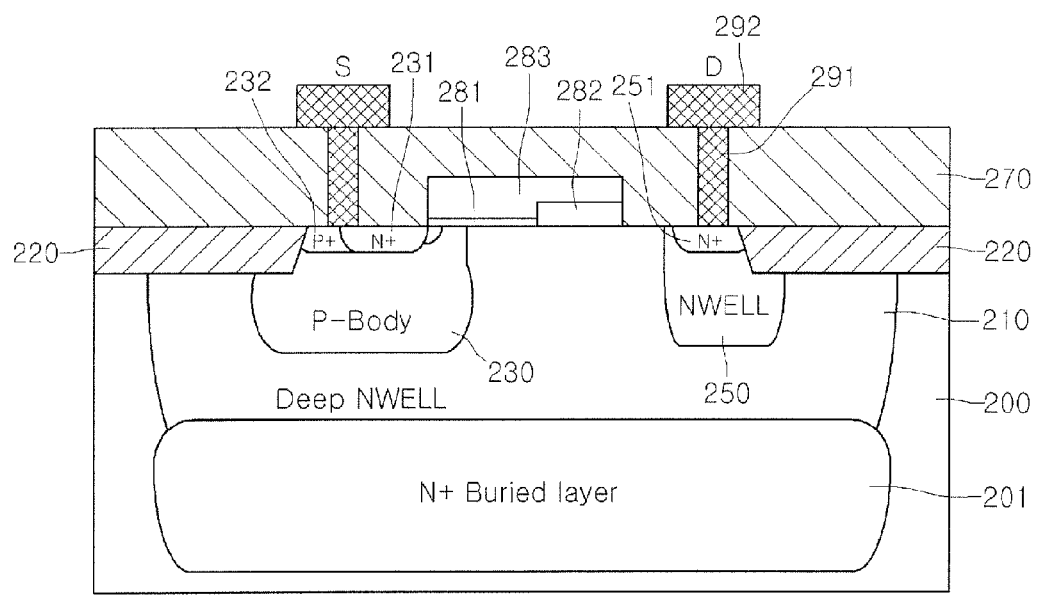

Referring to FIG. 8, after the gate oxides 281 and 282 and the gate electrode 283 have been formed, the N+ type source region 231, the P+ type contact region 232, and the N+ type drain region 251 are formed in the semiconductor substrate 200 by implanting impurities into the semiconductor substrate 200.

Next, an interlayer dielectric layer 270 is formed on the semiconductor substrate 200, and contact plugs 291 are formed in the interlayer dielectric layer 270 such that the contact plugs 291 make contact with the source and drain regions through the interlayer dielectric layer 270. Metal contacts 292 are formed on the interlayer dielectric layer 270 such that the metal contacts are electrically connected to the contact plugs 291.

According to embodiments of the semiconductor device and the method of manufacturing the same, even if a low gate voltage is applied to an LDMOS device in a high voltage region, the LDMOS device can represent the performance of a high voltage device. Accordingly, a level shifter circuit is not required between low and high voltage regions.

In addition, since the level shifter circuit is not required, the chip size can be reduced. Further, the LDMOS device can be more easily manufactured as compared with that of the related art.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
    a substrate formed therein with a first conductive type well; and
    a lateral diffused metal oxide semiconductor (LDMOS) device formed on the substrate,
    wherein the LDMOS device includes a gate electrode, a gate oxide formed on the substrate below the gate electrode, a source region formed in the substrate at one side of the gate electrode, and a drain region formed in the substrate at an opposite side of the gate electrode, and
    wherein the gate oxide includes a first gate oxide and a second gate oxide side-by-side on the substrate, the first and second gate oxides having thicknesses different from each other;
    wherein the second gate oxide is thicker than the first gate oxide by a thickness in a range of 160 Å to 200 Å.

2. The semiconductor device of claim 1, wherein the second gate oxide is closer to the drain region than the first gate oxide.

3. A method of manufacturing a semiconductor device, the method comprising:
    forming a first conductive type deep well in a second conductive type substrate;
    forming a second conductive type body in the first conductive type deep well;
    forming a first conductive type well in the first conductive type deep well;
    forming a double structure gate oxide on the second conductive type substrate;
    forming a gate electrode on the double structure gate oxide; and
    forming a source region in the second conductive type body and a drain region in the first conductive type well,
    wherein the forming of the double structure gate oxide comprises:
    forming a first gate oxide on the second conductive type substrate; and
    forming a second gate oxide having a thickness different from a thickness of the first gate oxide on the second conductive type substrate at one side of the first gate oxide,
    wherein the second gate oxide is formed thicker than the first gate oxide by a thickness in a range of 160 Å to 200 Å.

4. The method of claim 3, wherein the second gate oxide is closer to the drain region than the first gate oxide.

* * * * *